US012640303B2

(12) United States Patent
Okuzawa et al.

(10) Patent No.: US 12,640,303 B2
(45) Date of Patent: May 26, 2026

(54) LAMINATED COIL COMPONENT

(71) Applicant: TDK CORPORATION, Tokyo (JP)

(72) Inventors: Nobuyuki Okuzawa, Tokyo (JP);
Munehiro Takaku, Tokyo (JP);
Kazuya Tobita, Tokyo (JP); Teruhiro Mitsuyasu, Tokyo (JP)

(73) Assignee: TDK CORPORATION, Tokyo (JP)

( * ) Notice: Subject to any disclaimer, the term of this patent is extended or adjusted under 35 U.S.C. 154(b) by 729 days.

(21) Appl. No.: 18/153,690

(22) Filed: Jan. 12, 2023

(65) Prior Publication Data

US 2023/0230757 A1     Jul. 20, 2023

(30) Foreign Application Priority Data

Jan. 17, 2022     (JP) ................................. 2022-005065

(51) Int. Cl.
| | |
|---|---|
| *H01F 27/28* | (2006.01) |
| *H01F 27/29* | (2006.01) |
| *H03H 7/01* | (2006.01) |
| *H03H 1/00* | (2006.01) |

(52) U.S. Cl.
CPC ....... H01F 27/2804 (2013.01); H01F 27/292 (2013.01); H03H 7/0115 (2013.01); *H01F 2027/2809* (2013.01); *H03H 2001/0085* (2013.01)

(58) Field of Classification Search
CPC ........... H01F 2017/002; H01F 17/0013; H01F 2027/2809; H01F 27/2804; H03H 7/0115; H03H 2001/0085
USPC .......................... 336/186, 200; 333/175, 185
See application file for complete search history.

(56) References Cited

U.S. PATENT DOCUMENTS

| | | | |
|---|---|---|---|
| 2013/0120905 A1 | 5/2013 | Son et al. | |
| 2023/0096644 A1* | 3/2023 | Oishi | H01F 27/323 |
| | | | 336/192 |

FOREIGN PATENT DOCUMENTS

| | | |
|---|---|---|
| JP | 2005-167098 A | 6/2005 |
| JP | 2013-106030 A | 5/2013 |
| JP | 2015-141945 A | 8/2015 |

* cited by examiner

*Primary Examiner* — Rakesh B Patel
(74) *Attorney, Agent, or Firm* — OLIFF PLC

(57)     ABSTRACT
A laminated coil component includes an element body, a first terminal electrode and a second terminal electrode, and a coil, the coil includes a first wiring portion, a second wiring portion, and a pillar portion, the pillar portion has a first pillar member and a second pillar member alternately laminated in a second direction, and an area of a first surface and an area of a second surface of the first pillar member are larger than an area of a first surface and an area of a second surface of the second pillar member, or smaller than the area of the first surface and the area of the second surface of the second pillar member.

5 Claims, 3 Drawing Sheets

8A
8B
8Aa
8Ab
8Ba
8Bb 8
8A
8B
8A
8B
8Ab
8Aa
8Bb
8Ba 8
8A
8B
8A
8B

8A

8B

8A

8B

8A

8B

8A

8B

8A

8B

8A

8B

8A

8B

8A

8B

LAMINATED COIL COMPONENT

TECHNICAL FIELD

The present disclosure relates to a laminated coil component.

BACKGROUND

As a conventional laminated coil component, for example, one described in Patent Document 1 (Japanese Unexamined Patent Application Publication No. 2015-141945) is known. The laminated coil component described in Patent Document 1 includes an element body having a pair of end surfaces facing each other in a first direction, a mounting surface and a main surface facing each other in a second direction, and a pair of side surfaces facing each other in a third direction, a coil disposed in the element body, and a pair of terminal electrodes disposed on the mounting surface of the element body. The coil includes a first wiring portion disposed on the main surface side, a second wiring portion disposed on the mounting surface side, and a connection portion that extends in a second direction and connects the first wiring portion with the second wiring portion.

SUMMARY

The coil can be formed using a photolithographic method. In this case, since the connection portion of the coil is formed by performing a plurality of exposures and developments, a plurality of connection members are laminated. According to the accuracy of alignment during exposure in the manufacturing process of the connection member, lamination of the connection members may be misaligned. When the lamination of the connection members is misaligned, a contact area between the connection members may decrease, and characteristics of the laminated coil component may deteriorate. In this way, the characteristics of the laminated coil component may vary because the characteristics may change due to the lamination of the connection members.

An object of one aspect of the present disclosure is to provide a laminated coil component capable of suppressing variations in characteristics.

A laminated coil component according to one aspect of the present disclosure includes an element body having a pair of end surfaces facing each other in a first direction, a mounting surface and a main surface facing each other in a second direction, and a pair of side surfaces facing each other in a third direction, a pair of terminal electrodes disposed on the mounting surface of the element body, and a coil disposed in the element body and electrically connected to the pair of terminal electrodes, wherein the coil includes a first wiring portion disposed on the main surface side, a second wiring portion disposed on the mounting surface side, and a connection portion that extends in the second direction and connects the first wiring portion with the second wiring portion, the connection portion has a first connection member and a second connection member alternately laminated in the second direction, the first connection member has a first surface and a second surface that face each other in the second direction, the second connection member has a third surface and a fourth surface that face each other in the second direction, and an area of the first surface and an area of the second surface are larger than an area of the third surface and an area of the fourth surface, or smaller than the area of the third surface and the area of the fourth surface.

In the laminated coil component according to one aspect of the present disclosure, the area of the first surface and the area of the second surface are larger than the area of the third surface and the area of the fourth surface, or smaller than the area of the third surface and the area of the fourth surface. In such a configuration, when the first surface or the second surface of the first connection member and the third surface or the fourth surface of the second connection member are in contact with each other, a contact area between the first surface or the second surface of the first connection member and the third surface or the fourth surface of the second connection member can be secured. For example, in a case in which the area of the first surface and the area of the second surface are larger than the area of the third surface and the area of the fourth surface, when the first surface and the third surface are in contact with each other, since the area of the first surface is larger than the area of the third surface, the third surface can be located within the first surface even when a position of the second connection member is misaligned with the first connection member. Therefore, a contact area corresponding to at least the area of the third surface can be secured. In this way, in the laminated coil component, even when the lamination of the first connection member and the second connection member is misaligned, a certain contact area between the first connection member and the second connection member can be secured (an amount of change in contact area can be reduced) when compared with a case in which the area of the first surface and the area of the second surface are the same as the area of the third surface and the area of the fourth surface. Therefore, in the laminated coil component, it is possible to suppress variations in the contact area between the first connection member and the second connection member. As a result, it is possible to suppress variations in characteristics of the laminated coil component.

In one embodiment, when seen in the second direction, one side outer edges of the first surface and the second surface of the first connection member and the third surface and the fourth surface of the second connection member may be disposed within the other side outer edges of the first surface and the second surface of the first connection member and the third surface and the fourth surface of the second connection member. In such a configuration, a certain contact area between the first connection member and the second connection member can be secured more reliably.

In one embodiment, one end portion of the connection portion in the second direction may be the first connection member, and the other end portion of the connection portion in the second direction may be the second connection member.

In one embodiment, when seen in the second direction, shapes of the first surface and the second surface may be different from shapes of the third surface and the fourth surface.

In one embodiment, a plurality of the first wiring portions may be disposed side by side in the third direction, a plurality of the second wiring portions may be disposed side by side in the third direction, a plurality of the connection portions may be provided to connect the first wiring portion with the second wiring portion which correspond to each other, and in the plurality of connection portions, shapes of the first connection member and the second connection member of one connection portion may be different from shapes of the first connection member and the second connection member of another connection portion. In such a configuration, characteristics can be adjusted by changing the shapes of the first connection member and the second connection member in each of the connection portions.

According to one aspect of the present disclosure, it is possible to suppress variations in characteristics.

DETAILED DESCRIPTION

Figure 1:
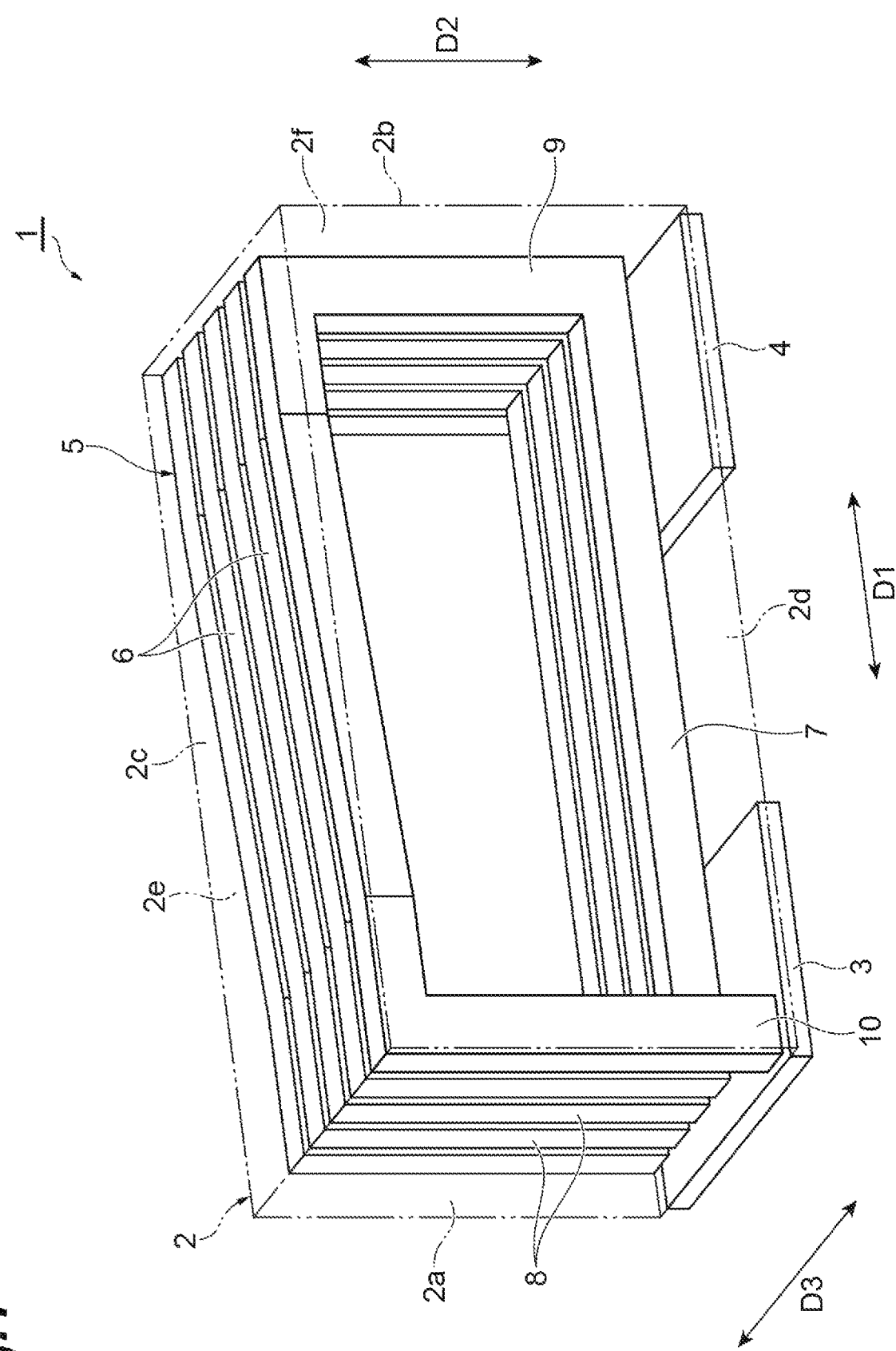
FIG. 1 is a perspective view of a laminated coil component according to one embodiment.

Exemplary embodiments of the present disclosure will be described in detail below with reference to the accompanying drawings. In the description of the drawings, the same or corresponding elements are designated by the same reference numerals, and overlapping descriptions thereof will be omitted.

A laminated coil component according to the present embodiment will be described with reference to FIG. 1. FIG. 1 is a perspective view of a laminated coil component according to one embodiment. As shown in FIG. 1, the laminated coil component 1 includes an element body 2, a first terminal electrode 3, and a second terminal electrode 4, a coil 5, a first connection portion 10, and a second connection portion (not shown). In FIG. 1, the element body 2 is indicated by an alternating long and two short dashes line for convenience of description.

The element body 2 has a rectangular parallelepiped shape. The rectangular parallelepiped shape includes a rectangular parallelepiped shape with chamfered corners and edges, and a rectangular parallelepiped shape with rounded corners and edges. The element body 2 has, as outer surfaces, a pair of end surfaces 2a and 2b, a pair of main surfaces 2c and 2d, and a pair of side surfaces 2e and 2f. The end surfaces 2a and 2b face each other. The main surfaces 2c and 2d face each other. The side surfaces 2e and 2f face each other. Hereinafter, a facing direction of the end surfaces 2a and 2b is defined as a first direction D1, a facing direction of the main surfaces 2c and 2d is defined as a second direction D2, and a facing direction of the side surfaces 2e and 2f is defined as a third direction D3. The first direction D1, the second direction D2, and the third direction D3 are substantially orthogonal to each other.

The end surfaces 2a and 2b extend in the second direction D2 so as to connect the main surfaces 2c and 2d. The end surfaces 2a and 2b also extend in the third direction D3 so as to connect the side surfaces 2e and 2f. The main surfaces 2c and 2d extend in the first direction D1 so as to connect the end surfaces 2a and 2b. The main surfaces 2c and 2d also extend in the third direction D3 so as to connect the side surfaces 2e and 2f. The side surfaces 2e and 2f extend in the first direction D1 so as to connect the end surfaces 2a and 2b. The side surfaces 2e and 2f also extend in the second direction D2 so as to connect the main surfaces 2c and 2d.

The main surface 2d is a mounting surface and is a surface that faces another electronic device (for example, a circuit base material or a laminated electronic component) when the laminated coil component 1 is mounted on another electronic device which is not shown. The end surfaces 2a and 2b are surfaces continuous from the mounting surface (that is, the main surface 2d).

A length of the element body 2 in the first direction D1 is longer than a length of the element body 2 in the second direction D2 and a length of the element body 2 in the third direction D3. The length of the element body 2 in the second direction D2 is shorter than the length of the element body 2 in the third direction D3. That is, in the present embodiment, each of the end surfaces 2a and 2b, the main surfaces 2c and 2d, and the side surfaces 2e and 2f has a rectangular shape. The length of the element body 2 in the second direction D2 may be equivalent to the length of the element body 2 in the third direction D3, or may be longer than the length of the element body 2 in the third direction D3.

In the present embodiment, "equivalent" may be equivalent to values including slight differences or manufacturing errors within a preset range, in addition to being equal. For example, multiple values are defined as equivalent when they fall within ±5% of an average value of the multiple values.

For the element body 2, a plurality of element body layers (not shown) are laminated in the second direction D2. That is, a laminating direction of the element bodies 2 is the second direction D2. In the actual element body 2, the plurality of element body layers may be integrated to such an extent that boundaries between the layers are not visually recognizable, or may be integrated so that the boundaries between the layers are visually recognizable.

The element body layer is a resin layer. A material of the element body layer includes at least one selected from, for example, a liquid crystal polymer, a polyimide resin, crystalline polystyrene, an epoxy-based resin, an acrylic-based resin, a bismaleimide-based resin, and a fluorine-based resin. The element body layer contains a filler. The filler is, for example, an inorganic filler. Examples of the inorganic filler include silica. The element body layer may not contain a filler.

The element body layer may contain a magnetic material. The magnetic material of the element body layer includes, for example, a Ni—Cu—Zn-based ferrite material, a Ni—Cu—Zn—Mg-based ferrite material, or a Ni—Cu-based ferrite material. The magnetic material of the element body layer may contain, for example, an Fe alloy. The element body layer may contain, for example, a non-magnetic material. The non-magnetic material of the element body layer includes, for example, a glass-ceramic material or a dielectric material.

Each of the first terminal electrode 3 and the second terminal electrode 4 is provided on the element body 2. Each of the first terminal electrode 3 and the second terminal electrode 4 is disposed on a main surface 2d of the element body 2. The first terminal electrode 3 and the second terminal electrode 4 are provided on the element body 2 so as to be separated from each other in the first direction D1. Specifically, the first terminal electrode 3 is disposed on the end surface 2a side of the element body 2. The second terminal electrode 4 is disposed on the end surface 2b side of the element body 2.

Each of the first terminal electrode 3 and the second terminal electrode 4 has a rectangular shape. Each of the first terminal electrode 3 and the second terminal electrode 4 is disposed such that each side thereof follows the first direction D1 or the third direction D3. The first terminal electrode 3 and the second terminal electrode 4 protrude more than the main surface 2d. That is, in the present embodiment, the respective surfaces of the first terminal electrode 3 and the second terminal electrode 4 are not flush with the main surface 2*d*. The first terminal electrode 3 and the second terminal electrode 4 are made of a conductive material (for example, Cu).

Each of the first terminal electrode 3 and the second terminal electrode 4 may have a plating layer (not shown) containing, for example, Ni, Sn, Au, or the like due to electrolytic plating or electroless plating. The plating layer may include, for example, a Ni plating film containing Ni and covering the first terminal electrode 3 and the second terminal electrode 4, and an Au plating film containing Au and covering the Ni plating film.

The coil 5 is disposed inside the element body 2. The coil 5 has a plurality of first wiring portions 6, a plurality of second wiring portions 7, and a plurality of pillar portions (connection portions) 8. The coil 5 is configured by electrically connecting the first wiring portions 6, the second wiring portions 7, and the pillar portions 8. A coil axis of the coil 5 is provided in the third direction D3. The plurality of first wiring portions 6, the plurality of second wiring portions 7, and the plurality of pillar portions 8 are made of a conductive material (for example, Cu). The first wiring portions 6, the second wiring portions 7, and the pillar portions 8 are disposed apart from the end surfaces 2*a* and 2*b*, the main surfaces 2*c* and 2*d*, and the side surfaces 2*e* and 2*f*.

Each of the first wiring portions 6 is disposed on the main surface 2*c* side of the element body 2. Each of the first wiring portions 6 extends in the first direction D1. Each of the first wiring portions 6 connects two pillar portions 8. The first wiring portions 6 span between the two pillar portions 8. One end portion of the first wiring portion 6 in an extending direction (an end portion on the end surface 2*a* side) is connected to one end portion of the pillar portion 8 (an end portion on the main surface 2*c* side). The other end portion of the first wiring portion 6 in the extending direction (an end portion on the end surface 2*b* side) is connected to one end portion of the pillar portion 8.

Each of the second wiring portions 7 is disposed on the main surface 2*d* (the mounting surface) side of the element body 2. Each of the second wiring portions 7 extends in the first direction D1. Each of the second wiring portions 7 connects the two pillar portions 8. The second wiring portions 7 span between the two pillar portions 8. One end portion of the second wiring portion 7 in the extending direction (an end portion on the end surface 2*a* side) is connected to the other end portion of the pillar portion 8 (the end portion on the main surface 2*d* side). The other end portion of the second wiring portion 7 in the extending direction (an end portion on the end surface 2*b* side) is connected to the other end portion of the pillar portion 8. The plurality of second wiring portions 7 is one less in number than the plurality of first wiring portions 6. That is, when the number of the first wiring portions 6 is n, the number of second wiring portions 7 is n–1.

The pillar portions 8 are respectively disposed on the end surface 2*a* side and the end surface 2*b* side of the element body 2. Each of the pillar portions 8 extends in the second direction D2. The pillar portions 8 connect the first wiring portions 6 with the second wiring portions 7. One end portion of the pillar portion 8 is connected to one end portion and the other end portion of the first wiring portion 6. The other end portion of the pillar portion 8 is connected to one end portion and the other end portion of the second wiring portion 7.

The first connection portion 10 connects the first terminal electrode 3 with one end portion of the coil 5. The first connection portion 10 is connected to the other end portion of the first pillar portion 8 of the coil 5. The first connection portion 10 is made of a conductive material (for example, Cu). The second connection portion connects the second terminal electrode 4 with the other end portion of the coil 5. The second connection portion is connected to the other end portion of the pillar portion 8 of the coil 5. The second connection portion is made of a conductive material (for example, Cu).

Figures 2A, 2B, 2C:
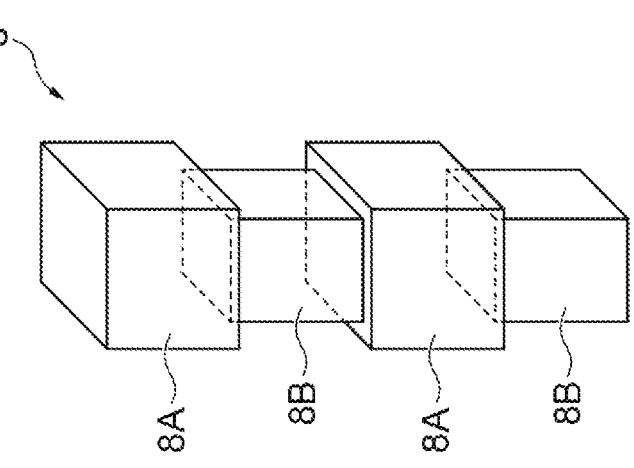
FIG. 2A is a perspective view showing a pillar portion.
FIG. 2B is a side view of the pillar portion.
FIG. 2C is a view of a part of the pillar portion seen in a second direction.

Next, the configuration of the pillar portion 8 of the coil 5 will be described in detail. FIG. 2A is a perspective view showing the pillar portion 8, FIG. 2B is a side view of the pillar portion 8, and FIG. 2C is a view of a part of the pillar portion 8 seen in the second direction D2.

As shown in FIGS. 2A, 2B, and 2C, the pillar portions 8 include a plurality of first pillar members (first connection members) 8A and a plurality of second pillar members (second connection members) 8B. In the pillar portions 8, the first pillar members 8A and the second pillar members 8B are alternately laminated. The example shown in FIGS. 2A and 2B shows a configuration in which two first pillar members 8A and two second pillar members 8B are laminated.

In the example shown in FIGS. 2A and 2B, the first pillar member 8A constitutes one end portion of the pillar portion 8, and the second pillar member 8B constitutes the other end portion of the pillar portion 8. In such a configuration, the first pillar member 8A is connected to the first wiring portion 6, and the second pillar member 8B is connected to the second wiring portion 7. In the pillar portion 8, when the number of the first pillar members 8A and the number of the second pillar members 8B are even numbers, one of the first pillar member 8A and the second pillar member 8B is connected to the first wiring portion 6, and the other one of the first pillar member 8A and the second pillar member 8B is connected to the second wiring portion 7.

As shown in FIG. 2A, the first pillar member 8A has a rectangular parallelepiped shape. As shown in FIG. 2B, the first pillar member 8A has a first surface 8Aa and a second surface 8Ab. The first surface 8Aa and the second surface 8Ab face each other in the second direction D2. Each of the first surface 8Aa and the second surface 8Ab has a rectangular shape.

As shown in FIG. 2A, the second pillar member 8B has a rectangular parallelepiped shape. As shown in FIG. 2B, the second pillar member 8B has a first surface (a third surface) 8Ba and a second surface (a fourth surface) 8Bb. The first surface 8Ba and the second surface 8Bb face each other in the second direction D2. Each of the first surface 8Ba and the second surface 8Bb has a rectangular shape. That is, the first surface 8Ba and the second surface 8Bb have the same shape as the first surface 8Aa and the second surface 8Ab.

The first pillar member 8A is larger than the second pillar member 8B. In other words, the second pillar member 8B is smaller than the first pillar member 8A. An area (a surface area) of each of the first surface 8Aa and the second surface 8Ab of the first pillar member 8A is larger than an area of each of the first surface 8Ba and the second surface 8Bb of the second pillar member 8B. In other words, the areas of the first surface 8Ba and the second surface 8Bb of the second pillar member 8B are smaller than the areas of the first surface 8Aa and the second surface 8Ab of the first pillar member 8A.

In the pillar portion 8, the first surface 8Aa of the first pillar member 8A and the second surface 8Bb of the second pillar member 8B are in contact with each other, and the second surface 8Ab of the first pillar member 8A and the first surface 8Ba of the second pillar member 8B are in contact with each other. As shown FIG. 2C, when seen in the second direction D2, outer edges of the first surface 8Ba and the second surface 8Bb of the second pillar member 8B are disposed within outer edges of the first surface 8Aa and the second surface 8Ab of the first pillar member 8A. The first surface 8Ba of the second pillar member 8B is located within the second surface 8Ab of the first pillar member 8A. That is, the entire surface of the first surface 8Ba of the second pillar member 8B is in contact with the second surface 8Ab of the first pillar member 8A. The second surface 8Bb of the second pillar member 8B is located within the first surface 8Aa of the first pillar member 8A. That is, the entire surface of the second surface 8Bb of the second pillar member 8B is in contact with the first surface 8Aa of the first pillar member 8A.

The laminated coil component 1 can be manufactured, for example, as follows. The element body 2 can be formed by laminating sheets constituting the element body layers. The coil 5 (the first wiring portions 6, the second wiring portions 7, the pillar portions 8), the first connection portion 10, and the second connection portion 11 can be manufactured using a photolithographic method. The "photolithography method" is not limited to the type of mask, or the like, as long as a desired pattern is processed by exposing and developing a layer to be processed containing a photosensitive material.

Specifically, regarding formation of the pillar portion 8, the first pillar member 8A (the second pillar member 8B) is formed by exposing and developing a layer to be processed containing a photosensitive material. Similarly, the second pillar member 8B (the first pillar member 8A) is formed on the first pillar member 8A (the second pillar member 8B). Thus, the pillar portion 8 is formed by forming the first pillar member 8A and the second pillar member 8B so as to be laminated.

As described above, in the laminated coil component 1 according to the present embodiment, the areas of the first surface 8Aa and the area of the second surface 8Ab of the first pillar member 8A are larger than the areas of the first surface 8Ba and the second surface 8Bb of the second pillar member 8B. In such a configuration, when the first surface 8Aa of the first pillar member 8A is in contact with the second surface 8Bb of the second pillar member 8B, and the second surface 8Ab of the first pillar member 8A is in contact with the first surface 8Ba of the second pillar member 8B, a contact area between the first surface 8Aa of the first pillar member 8A and the second surface 8Bb of the second pillar member 8B and a contact area between the second surface 8Ab of the first pillar member 8A and the first surface 8Ba of the second pillar member 8B can be secured. Thus, since the areas of the first surface 8Aa and the second surface 8Ab are larger than the areas of the first surface 8Ba and the second surface 8Bb, even when the second pillar member 8B is misaligned with the first pillar member 8A, the first surface 8Ba and the second surface 8Bb can be located within the first surface 8Aa and the second surface 8Ab. Thus, in the laminated coil component 1, a certain contact area between the first pillar member 8A and the second pillar member 8B can be secured (an amount of change in the contact area can be reduced). Therefore, in the laminated coil component 1, it is possible to suppress variation in the contact area between the first pillar member

8A and the second pillar member 8B. As a result, in the laminated coil component 1, it is possible to suppress variations in characteristics.

In the laminated coil component 1 according to the present embodiment, as shown in FIG. 2C, when seen in the second direction D2, the outer edges of the first surface 8Ba and the second surface 8Bb of the second pillar member 8B are disposed within the outer edges of the first surface 8Aa and the second surface 8Ab of the first pillar member 8A. With such a configuration, the constant area between the first pillar member 8A and the second pillar member 8B can be secured more reliably.

Although the embodiment of the present disclosure has been described above, the present disclosure is not necessarily limited to the above-described embodiment, and various modifications can be made without departing from the scope of the present disclosure.

In the above embodiment, the example in which the first terminal electrode 3 and the second terminal electrode 4 protrude more than the main surface 2d has been described. However, the first terminal electrode 3 and the second terminal electrode 4 may be embedded within the element body 2. That is, the first terminal electrode 3 and the second terminal electrode 4 may be provided to be substantially flush with the main surface 2d. In such a configuration, plating layers provided on each of the first terminal electrode 3 and the second terminal electrode 4 may protrude more than the main surface 2d.

In the above embodiment, the example in which the areas (the surface areas) of the first surface 8Aa and the second surface 8Ab of the first pillar member 8A are larger than the areas of the first surface 8Ba and the second surface 8Bb of the second pillar member 8B has been described. However, the areas of the first surface 8Aa and the second surface 8Ab of the first pillar member 8A may be smaller than the areas of the first surface 8Ba and the second surface 8Bb of the second pillar member 8B.

Figure 3A:
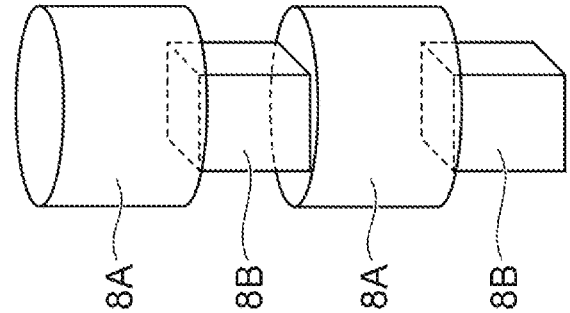
FIGS. 3A, 3B, 3C, and 3D are perspective views or side views of pillar portions of laminated coil components according to other embodiments.

In the above embodiment, in the pillar portion 8, the example in which the first pillar member 8A and the second pillar member 8B have a rectangular parallelepiped shape has been described. However, the shapes of the first pillar member 8A and the second pillar member 8B are not limited thereto. As shown in FIG. 3A, the first pillar member 8A and the second pillar member 8B may have different shapes. For example, the first pillar member 8A may have a cylindrical shape, and the second pillar member 8B may have a rectangular shape.

Figure 3B:
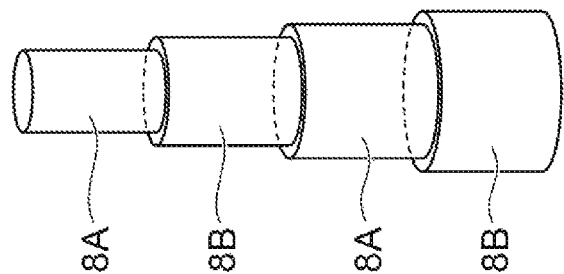
Figure 3C:
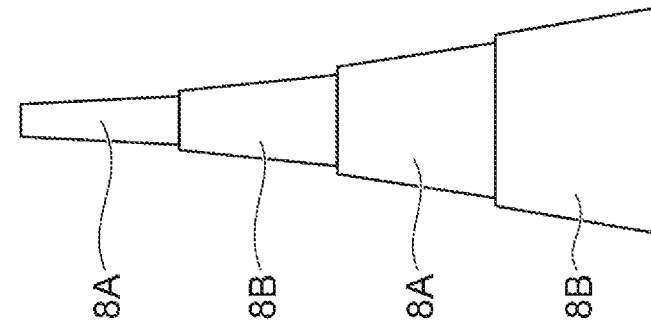
Figure 3D:
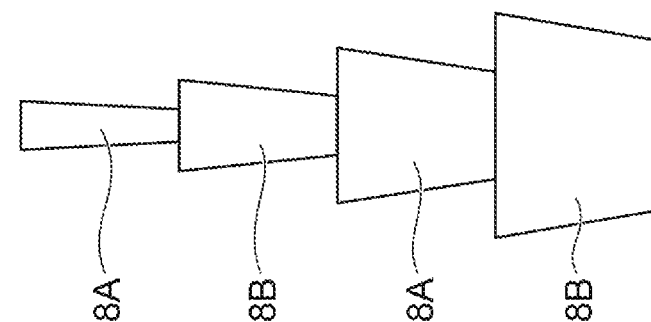

As shown in FIG. 3B, the first pillar member 8A and the second pillar member 8B may have a cylindrical shape. As shown in FIGS. 3C and 3D, the first pillar member 8A and the second pillar member 8B may have a truncated cone shape. In FIGS. 3C and 3D, the first pillar member 8A and the second pillar member 8B are directed differently (reversed) in the second direction D2.

In the above embodiment, the example in which the plurality of pillar portions 8 have the same configuration has been described. However, among the plurality of pillar portions 8, one pillar portion 8 and another pillar portion 8 may have different configurations. For example, one pillar portion 8 may have the configuration shown in FIGS. 2A, 2B, and 2C, and the other pillar portion 8 may have the configuration shown in FIG. 3A. With such a configuration, the characteristics of the laminated coil component 1 can be adjusted.

What is claimed is:

1. A laminated coil component comprising:

an element body having a pair of end surfaces facing each other in a first direction, a mounting surface and a main surface facing each other in a second direction, and a pair of side surfaces facing each other in a third direction;

a pair of terminal electrodes disposed on the mounting surface of the element body; and a coil disposed in the element body and electrically connected to the pair of terminal electrodes, wherein the coil includes a first wiring portion, a second wiring portion, and a connection portion that extends in the second direction and connects the first wiring portion with the second wiring portion, the first wiring portion being disposed between the main surface and the second wiring portion in the second direction, the second wiring portion being disposed between the mounting surface and the first wiring portion in the second direction, the connection portion has a first connection member and a second connection member that are in direct contact with each other and alternately laminated in the second direction, the first connection member has a first surface and a second surface that face each other in the second direction, the second connection member has a third surface and a fourth surface that face each other in the second direction, and an area of the first surface and an area of the second surface are larger than an area of the third surface and an area of the fourth surface, or smaller than the area of the third surface and the area of the fourth surface.

2. The laminated coil component according to claim 1, wherein, when seen in the second direction, the third surface and the fourth surface of the second connection member are disposed within the first surface and the second surface of the first connection member.

3. The laminated coil component according to claim 1, wherein one end portion of the connection portion in the second direction is the first connection member, and the other end portion of the connection portion in the second direction is the second connection member.

4. The laminated coil component according to claim 1, wherein, when seen in the second direction, shapes of the first surface and the second surface are different from shapes of the third surface and the fourth surface.

5. The laminated coil component according to claim 1, wherein a plurality of the first wiring portions are disposed side by side in the third direction, a plurality of the second wiring portions are disposed side by side in the third direction, a plurality of the connection portions are provided to connect the first wiring portion with the second wiring portion which correspond to each other, and in the plurality of connection portions, shapes of the first connection member and the second connection member of one connection portion are different from shapes of the first connection member and the second connection member of another connection portion.

* * * * *